United States Patent [19]

Solhjell

[11] Patent Number: 4,728,899
[45] Date of Patent: Mar. 1, 1988

[54] CIRCUIT ARRANGEMENT FOR THE CONVERSION OF ANALOG SIGNALS INTO BINARY SIGNALS

[75] Inventor: Erik Solhjell, Oslo, Norway

[73] Assignee: Tandberg Data A/S, Oslo, Norway

[21] Appl. No.: 902,178

[22] Filed: Aug. 29, 1986

[30] Foreign Application Priority Data

Aug. 29, 1985 [DE] Fed. Rep. of Germany ....... 3530949

[51] Int. Cl.$^4$ ............................................. H03K 5/01
[52] U.S. Cl. .................................... 328/150; 307/261; 307/268; 328/164
[58] Field of Search ....................... 307/261, 268, 354; 328/150, 163, 164

[56] References Cited

U.S. PATENT DOCUMENTS

| | | | |
|---|---|---|---|
| 3,665,327 | 5/1972 | Prentky et al. | 328/163 |
| 3,879,342 | 4/1975 | Patel | 360/45 |
| 4,045,743 | 8/1977 | Walker | 328/150 |
| 4,090,144 | 5/1978 | Jenik et al. | 328/150 |
| 4,382,298 | 5/1983 | Evans | 371/6 |
| 4,425,637 | 1/1984 | Tanaka et al. | 369/124 |
| 4,546,394 | 10/1985 | Yamamoto | 328/164 |

FOREIGN PATENT DOCUMENTS

58-194119  5/1982  Japan .

*Primary Examiner*—John Zazworsky
*Attorney, Agent, or Firm*—Hill, Van Santen, Steadman & Simpson

[57] ABSTRACT

For converting analog signals into binary signals which are respectively allocated to zero axis crossings of the analog signals, the analog signals are first converted into rectangular signals whose binary values change at the zero axis crossings of the analog signals. The rectangular signals are supplied to a delay unit which delays the rectangular signals in steps by a respective time duration which is short in comparison to a shortest period duration of the rectangular signals. Dependent on the various, simultaneously appearing binary values of the delayed rectangular signals, a processing unit generates binary signals which are respectively allocated to a correct zero axis crossing of the analog signals. The processing unit can contain a read-only memory and/or a microprocessor, and can also be fashioned such that it automatically adapts to disturbances present in the analog signals in order to generate correct binary signals, despite these disturbances.

8 Claims, 8 Drawing Figures

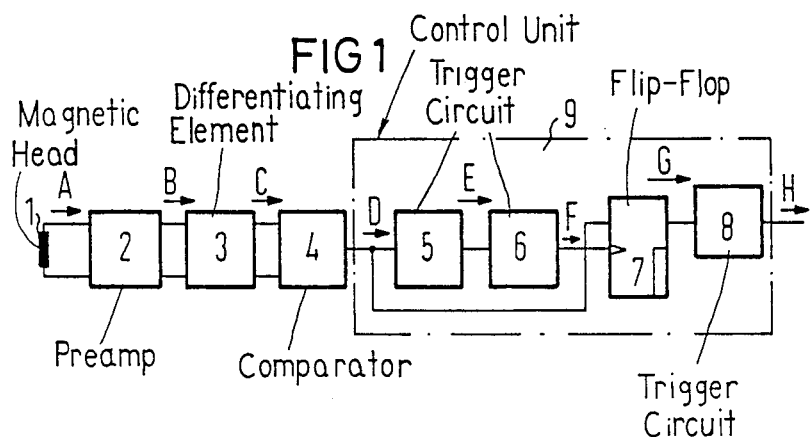
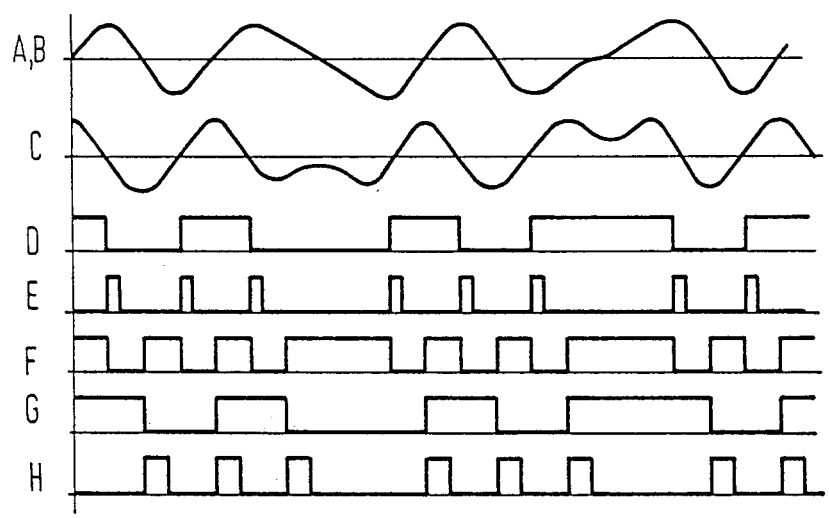

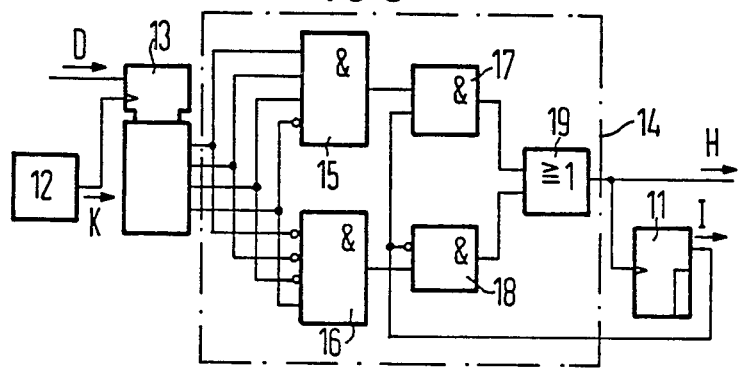
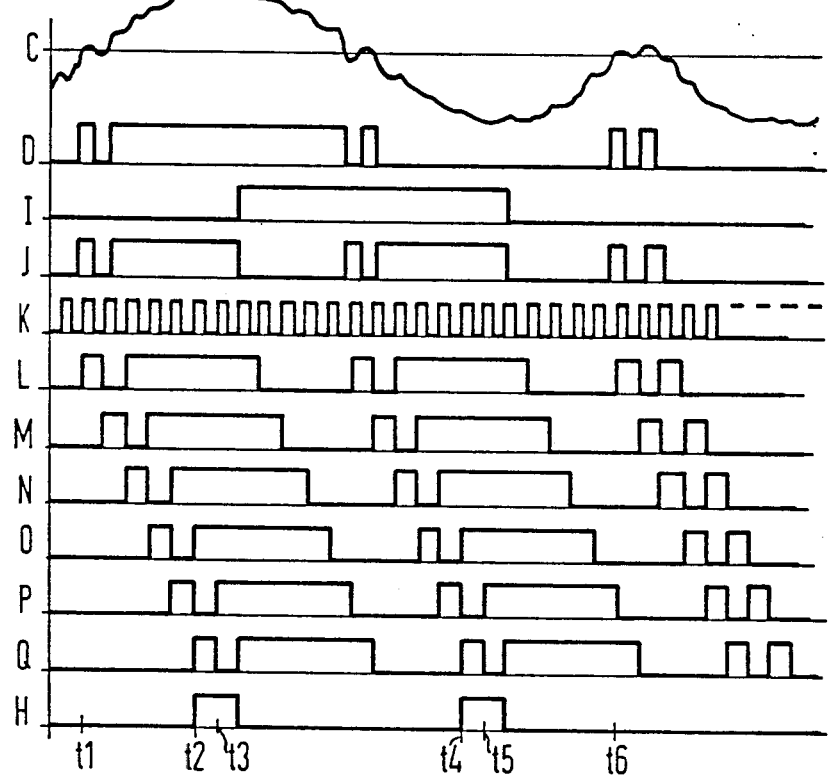

READ ONLY MEMORY

MICRO PROCESSOR

CIRCUIT ARRANGEMENT FOR THE CONVERSION OF ANALOG SIGNALS INTO BINARY SIGNALS

BACKGROUND OF THE INVENTION

The invention relates to a circuit arrangement for the conversion of analog signals into binary signals wherein rectangular signals are generated from the analog signals and edges of the rectangular signals are allocated to zero axis crossings of the analog signals.

In numerous signal processing units, particularly for a magnetic or optical recording of data on a recording medium, analog signals are converted into corresponding binary signals which are respectively allocated to a change of status of the recording medium.

It would be conceivable to first limit the analog signals and to amplify them for the conversion of these analog signals into binary signals. In case read output signals of magnetic recording media are provided as analog signals, the read output signals generated by the read head are usually differentiated after a pre-amplification in order to allocate the maximum values and minimum values of the read output signals to zero axis crossings of the differentiated read output signals, which shall be referred to in the following as analog signals. As already mentioned, these analog signals are then converted into corresponding rectangular signals by amplification and limitation. Pulses are generated at every change of the binary values of the rectangular signals, these pulses driving a one-shot multivibrator whose delay time corresponds to about half the shortest period duration of the analog signals or of the rectangular signals. After the delay time, the respective binary values of the rectangular signals are interrogated and a binary signal is generated at every change of the binary values of the rectangular signals.

The one-shot multi-vibrator serves a time-domain filter, predominantly for eliminating brief-duration disturbances of the analog signals and thus of the rectangular signals as well. In case, however, disturbances are contained in the analog signals or rectangular signals after the expiration of the delay time, these can lead to faulty binary signals.

SUMMARY OF THE INVENTION

It is an object of the invention to specify a circuit arrangement for the conversion of analog signals into binary signals which recognizes the changes of the binary values of the rectangular signals and thus the zero axis crossings of the analog signals, even given the presence of disturbances. It is also desired to eliminate further disturbances within the rectangular signals or analog signals with great reliability.

In a circuit arrangement of the type described above, this object is achieved by providing a control means having delay means for delaying rectangular signals and a plurality of parallel outputs at which delayed rectangular signals are output. The delayed rectangular signals are delayed in steps by a prescribed time duration which is significantly shorter than a period duration of the rectangular signals. The control means also has a processing means at which the delayed rectangular signals are present for generating a binary signal when the delayed rectangular signals simultaneously have prescribed binary values.

The circuit arrangement requires low expense and enables a reliable recognition of the zero axis crossings of the analog signals or of the changes of the binary values of the rectangular signals.

Preferably provided as a delay unit is a shift register into which the rectangular signals are serially rolled by clock pulses having a period duration which is significantly shorter than the shortest period duration of the analog signals. The delayed rectangular signals are output at the parallel outputs of this shift register. By changing the repetition rate of the clock pulses, the circuit arrangement can be set to various period durations of the analog signals in an extremely simple way.

The delay unit can also be fashioned of analog components as a standard delay unit.

A separate delay unit can be provided for every direction of the change of the binary values of the rectangular signals. Preferably, however, a single delay unit is provided. In this case, the delay unit can be preceded by an exclusive-OR element at whose first input the rectangular signals are present and at whose second input the output signal of a flip-flop is present, this flip-flop flipping into its respectively opposite position with every appearance of a binary signal. In this case, for example, a processing unit fashioned as an AND element need only be designed such that it recognizes changes of the binary values of the rectangular signals in one direction. It is also possible to provide a separate switching stage for each direction of the change of the binary values of the rectangular signals, and to connect the outputs of the switching stages to the inputs of an OR element at whose output the binary signals are emitted. Preferably, AND elements are provided between the switching stages and OR element. First inputs of these AND elements are respectively connected to the outputs of the switching stages. The output signal of a flip-flop which flips into the respectively opposite position at every occurrence of the binary signal is present at the second input of these AND elements.

The processing unit can also contain a read-only memory which allocates corresponding binary signals to a plurality of possible binary values of the delayed rectangular signals at the parallel outputs of the delay unit. For example, corresponding binary signals can be generated in the read-only memory for all possible binary values of the delayed rectangular signals. These binary signals recognize the changes and/or the retention of binary values of the rectangular signals. In a preferred embodiment, the processing unit can also contain a microprocessor. The processing unit can also be designed such that it respectively automatically adapts to disturbances contained in the rectangular signals and, given appearance of these disturbances, generates the binary signals dependent on the binary values of the delayed rectangular signals which are then present. In this case, for example, the processing unit is designed such that, upon employment of possible binary values of the delayed rectangular signals which correspond to undisturbed signals, it first attempts to generate the binary signals. Only after a plurality of failed attempts does the processing unit generate these binary signals by use of other, possible binary values of the delayed rectangular signals.

BRIEF DESCRIPTION OF THE DRAWINGS

FIG. 1 is a block circuit diagram of a circuit arrangement for the conversion of analog signals into binary signals;

FIG. 2 shows time diagrams of signals at various points of the circuit arrangement shown in FIG. 1;

FIG. 5 is a second exemplary embodiment of a circuit arrangement of the invention;

FIG. 6 shows time diagrams of signals at various points of the circuit arrangement illustrated in FIG. 5;

DESCRIPTION OF THE PREFERRED EMBODIMENTS

Figure 3:
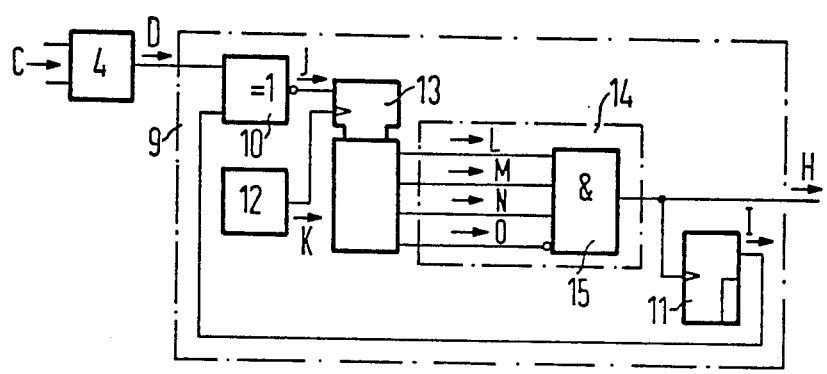
FIG. 3 is a first exemplary embodiment of a circuit arrangement of the invention.

Given the circuit arrangement shown in FIG. 1, binary signals H are generated from analog signals C to which read output signals A of a magnetic head 1 are allocated, given recording of data on a magnetic recording medium. A preamplifier 2 amplifies the read output signals A and emits the amplified read output signals B to a differentiating element which has respective zero axis crossings at the extreme values of the read output signals B. The differentiated read output signals C, which shall be referred to below as analog signals, are supplied to a comparator 4 which generates rectangular signals D allocated to the analog signals. The binary values of these rectangular signals D are allocated to the polarities of the analog signals C. The rectangular signals D are supplied to a control unit 9 which generates the binary signals H allocated to the changes of the binary values of the rectangular signals D.

Further details of the circuit arrangement shall be set forth below, together with the time diagrams shown in FIG. 2.

The read output signals A shown in FIG. 2 and the amplified read output signals B—which differ from one another only on the basis of a gain factor—comprise extreme values at prescribed points in time which are allocated to the changes of the magnetization of the magnetic recording medium. After the differentiation by the differentiating element 3, these extreme values are converted into zero axis crossings. When prescribed thresholds are fallen below or exceeded, the comparator 4 generates the rectangular signals D which respectively exhibit the binary value 1 given positive analog signals C, and the binary value 0 given negative analog signals C. The information stored on the recording medium lies in the change of the binary values and in the spacings between these changes. The rectangular signals D therefore exhibit different period durations, dependent on the data to be recorded. The comparator 4 can comprise a prescribed hysteresis and/or prescribed threshold voltages. It is generally standard to modify the threshold voltages, dependent on whether the read output signal A is checked immediately after writing, or is evaluated during a normal read event. In the former instance, a high threshold voltage is provided, whereas a low threshold voltage is provided in the latter case.

The changes of the binary values of the rectangular signals D are allocated to the magnetization changes on the recording medium and, theoretically, it is very simple to convert these changes into individual binary signals H, whereby a respective binary signal H is generated for each change. However, it is standard to provide a time-domain filter in the control unit 9 as a consequence of the band width of the transmission system and as a consequence of what are referred to as peak-to-valley errors, small amplitudes of the read output signals A, and as a consequence of disturbances.

The rectangular signals D are supplied to a one-shot multivibrator 5 which always generates a pulse E when the binary values of the rectangular signals D change.

The pulses E are supplied to a one-shot multivibrator 6 which represents the time-domain filter. This one-shot multivibrator 6 has a delay time which is shorter than the shortest period duration between two changes of the binary values of the rectangular signals D, but which is longer than the duration of typical disruptions due to a peak-to-valley ratio or other noise signals.

The output signals of the one-shot multivibrator 6 are supplied to the clock input of a flip-flop 7 at whose data input the rectangular signals D are present. After each and every delay time, the respective binary value of the rectangular signals D is rolled into the flip-flop 7. The output signal G of the flip-flop 7 is supplied to a further one-shot multivibrator 8 which generates a binary signal H in the form of a pulse, given every change of the binary values of the signals G. Instead of using the binary signals H, it is also possible to use the signals G at the output of the flip-flop 7 as binary signals.

For the further processing of the binary signals H, it is also standard to additionally provide a time check. This occurs by only evaluating the binary signals H when they occur within a prescribed frame generated on the basis of at least one preceding binary signal H. This, for example, can occur with a plurality of one-shot multivibrators, or can occur with a phase-locked control loop.

Given high recording densities on the recording medium and small amplitudes of the read output signals A, it can occur that faulty binary signals H are generated as a consequence of a disturbance, or that the time-domain filter is erroneously driven so that the binary signal H is blanked out.

The circuit arrangement shown in FIG. 3 shows a control unit 9 which can be employed instead of the control unit 9 employed in FIG. 1, and which shall be set forth below, together with the time diagrams shown in FIG. 4.

The control unit 9 is supplied with the rectangular signals D which are generated from the analog signals C upon use of the comparator 4. The rectangular signals D are supplied to a first input of an exclusive-OR element 10 at whose second input an output signal I of a flip-flop 11 is present. This flip-flop 11 is flipped into the respectively opposite position with every binary signal H. It is assumed that the signal I has the binary value 0 before point in time t1. When the analog signal C crosses the zero axis at point in time t1 and the rectangular signal D assumes the binary value 1, then the output signal J of the exclusive-OR element 10 also has the binary value 1. Upon employment of clock pulses K having a high repetition rate which are generated in a pulse generator 12, the signal J is serially rolled into a shift register 13. The shift register 13, for example, is a four-stage device and emits delayed rectangular signals L through O at its parallel outputs which are respectively delayed relative to one another by a period duration of the clock pulses K.

The delayed rectangular signals L through O are supplied to a processing unit 14 which, for example, is fashioned as an AND element 15, whereby the delayed rectangular signal O is supplied in inverted fashion. When the delayed rectangular signals L through N exhibit the binary value 1 and the delayed rectangular signal O exhibits the binary value 0, the processing unit 14 emits a binary signal H at point in time t2. This binary signal H is allocated to the change of the binary value of the rectangular signal at point in time t1 since the binary pattern 1110 appears at the outputs of the shift register 13 only at that point in time when the binary value of the rectangular signal D changes.

The flip-flop 11 is triggered with the trailing edge of the binary signal H at point in time t3, so that the signal I assumes the binary value 1. Whereas the exclusive-OR element 10 had previously connected the data signals D through in unmodified fashion as signal J, the rectangular signal D is connected through inverted thereafter.

When the analog signal C falls below the 0 axis at point in time t4 and the rectangular signal D again changes its binary value, the same process occurs between points in time t4 and t6 as occurred between points in time t1 and t3, whereby a binary signal H is again output at point in time t5.

The flip-flop 11 is again reset at point in time t6 and the signal I again assumes the binary value 0, so that the rectangular signal D is again connected through to the shift register 13 in unmodified fashion. When the analog signal C again crosses the zero axis at point in time t7 and again falls below the zero axis at point in time t8, the same events reoccur between points in time t7 and t9 as occurred between points in time t1 and t6.

Due to the control unit 9 comprising the delay unit 13 and the processing unit 14, the changes of the binary values of the rectangular signal D are recognized with great precision. For example, the analog signal C can sag to such a degree in the center between the points in time t4 and t7 that it touches or crosses the zero axis, and additional rectangular signals D are generated. These rectangular signals D are not evaluated by the processing unit 14 since the binary values of the delayed rectangular signals D through O do not correspond to the prescribed binary pattern 1110 which is allocated to a change of the binary values of the rectangular signals D.

The period duration of the clock pulses K is significantly shorter than the shortest period duration of the rectangular signals D and is adapted to the length of the shift register 13. In case the shift register 13 comprises more than four stages, the repetition rate of the clock pulses K would be correspondingly increased.

Instead of the shift register 13, a standard delay element formed of analog components can also be employed, this being provided with corresponding, parallel outputs.

It is also possible to provide a separate shift register 13 for every direction of the change of the binary values of the rectangular signals D, so that only the changes of the binary values from 0 to 1 are rolled into the first shift register, and only the changes of the binary values from 1 to 0 are rolled into the second shift register.

Given the control unit 9 shown in FIG. 3, the control unit 14 is fashioned such that it recognizes changes of the binary values of the rectangular signals D from 0 to 1. Due to the employment of the flip-flop 11 and of the exclusive-OR element 10, a recognition of the change from 1 to 0 can be foregone here, since, due to the signal I and the exclusive-OR element 10, all changes of the binary values from 0 to 1 and from 1 to 0 of the rectangular signals D are converted into changes of the binary values from 0 to 1 in the signal J.

Figure 7:
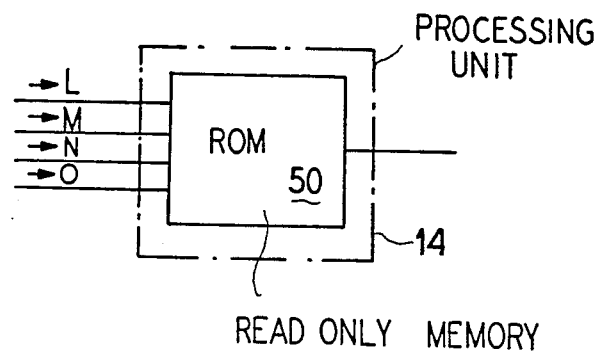
FIG. 7 shows an embodiment with a read only memory in the processing unit.
Figure 8:
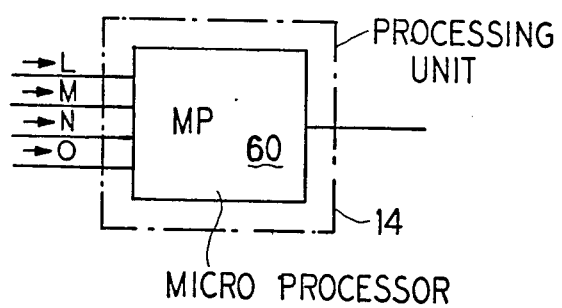
FIG. 8 shows an embodiment with a microprocessor in the processing unit.

The processing unit 14 can also contain a read-only memory 50 as shown in FIG. 7 in which binary signals H corresponding to every possible combination of the binary values of the delayed rectangular signals L through O are allocated. The processing unit 14 can also contain a microprocessor 60 as shown in FIG. 8 which is provided with a programmable memory, so that the control unit 9 can automatically adapt to the analog signals C to be respectively converted. For example, given slight disturbances, evaluations can occur by simply checking the binary values of the delayed rectangular signals L through O, whereas, given great disturbances, further possible combinations of the binary values of the delayed rectangular signals L through O must be taken into consideration. In this way, the control unit 9 can dynamically adapt to the respective use situation.

In the circuit arrangement shown in FIG. 5, the processing unit 14 contains a separate switching stage for each direction of the change of the binary values of the rectangular signals D, whereby the switching stage 15 corresponds to the AND element 15 in FIG. 3 which recognizes the change of the binary values of the rectangular signals D from 0 to 1. The switching stage 16 is additionally provided, this likewise designed as an AND element, and recognizes the change of the binary values of the rectangular signals D from 1 to 0. Each of the switching stages 15 or 16 is followed by an AND element 17 or 18 to which the output signal I of the flip-flop 11 is supplied, whereby the signal I is supplied to the AND element 18 in inverted fashion. Dependent on the binary value of the signal I, the AND elements 17 and 18 thus connect either the output signal of the switching stage 15 or the output signal of the switching stage 16 through to an OR element 19, at whose output terminal the binary signals H are output. As a result of the employment of the two switching stages 15 and 16, the exclusive-OR element 10 which precedes the delay unit 13 is not required.

The time diagrams illustrated in FIG. 6 show analog signals C which have relatively great noise signals superimposed on them. The analog signals C also have such a sag that additional peak-to-valley errors occur between two true zero axis crossings of the analog signals C.

The rectangular signals D which are again generated with a prescribed hysteresis and prescribed threshold voltages with use of a comparator 4, exhibit noise pulses in the region of the zero axis crossings and of the sag of the analog signals C.

In the circuit arrangement, the rectangular signals D are supplied to a control unit 9 which corresponds to the control unit shown in FIG. 3, but which comprises a six-stage shift register as a delay unit 13 at whose parallel outputs the delayed rectangular signals L through Q are output. Furthermore, the processing unit 14 is designed such that it recognizes not only undisturbed changes of the binary values of the rectangular signals D, but also recognizes disturbed changes. For this purpose, for example, the processing unit 14 contains a read-only memory which emits a binary signal H not only when the signals L through Q exhibit the binary values 111110, but also when these exhibit the binary values 111101.

Figure 4:
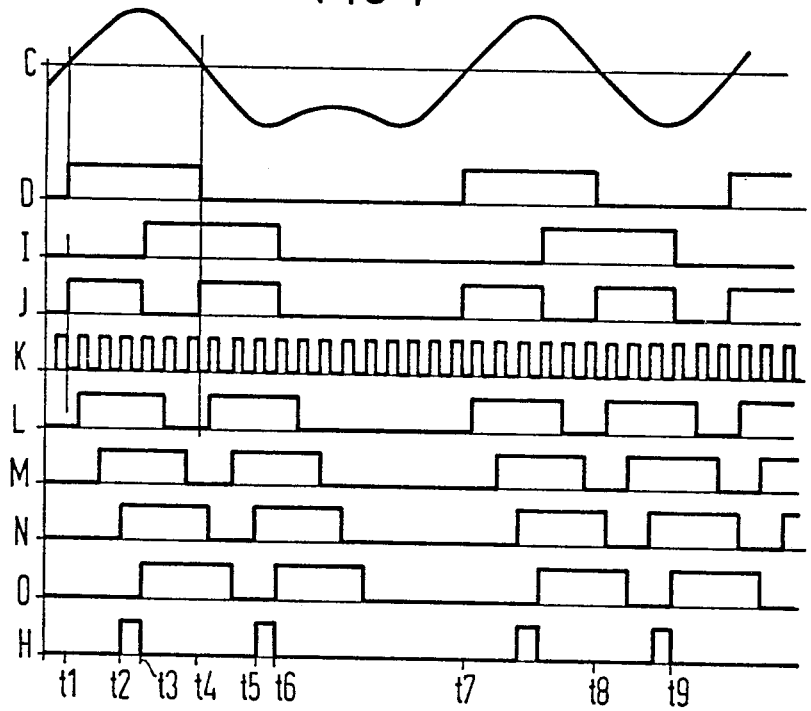
FIG. 4 shows time diagrams of signals at various points of the circuit arrangement shown in FIG. 3.

In a corresponding way, as in the time diagrams shown in FIG. 4, the signals J at the output of the exclusive-OR element 10 are rolled into the shift register 13 by use of the clock pulses K. After point in time t1, essentially the same events as after point in time t1 in FIG. 4 thereby repeat. At point in time t2, the processing unit 14 identifies the binary values 111101 of the delayed rectangular signals L through Q and emits a binary signal H, since it is not only the binary values 111101, but also the binary values 111101 which are to be interpreted as a zero axis crossing of the analog signals C. Since the binary values 111110 appear at point in time t3, the binary signal H continues to be output. It would also be conceivable to additionally interpret the binary values 111010 as a correct zero axis crossing as well, so that the binary signal H would already begin before the point in time t2. A binary signal H is also output at points in time t4 and t5 in a corresponding fashion, since the delayed rectangular signals L through Q exhibit the binary values 111101 or 111110 at these points in time.

A peak-to-valley ratio error occurs after point in time t6 and the rectangular signals D exhibit two pulses. The processing unit 14, however, recognizes these pulses as peak-to-valley ratio errors since the delayed rectangular signals L through Q exhibit neither the binary values 111101 nor the binary values 111110. No binary signal H is thus generated as a consequence of the peak-to-valley ratio error.

Although various minor changes and modifications might be proposed by those skilled in the art, it will be understood that I wish to include within the claims of the patent warranted hereon all such changes and modifications as reasonably come within my contribution to the art.

I claim as my invention:

1. A circuit arrangement for conversion of analog signals into binary signals, comprising:

means for generating rectangular signals from said analog signals wherein edges of said rectangular signals are allocated to zero axis crossings of said analog signals;

a control means for always normally generating binary signals from said rectangular signals when said rectangular signals change their binary values;

said control means having delay means for delaying said rectangular signals and a plurality of parallel outputs at which delayed rectangular signals are output, the delayed rectangular signals being delayed in steps by a prescribed time duration which is significantly shorter than a period duration of said rectangular signals;

said control means having a processing means at which said delayed rectangular signals are present for generating a binary signal when said delayed rectangular signals simultaneously have prescribed binary values; and said delay means being preceded by an exclusive-OR element at whose first input said rectangular signals are connected and at whose second input an output signal of a flip-flop means is connected, said flip-flop means flipping into a respectively opposite position with every appearance of a binary signal.

2. A circuit arrangement according to claim 1 wherein said processing means contains a read-only memory means for allocating binary signals corresponding to a plurality of possible, simultaneously appearing binary values of delayed rectangular signals at parallel outputs of said delay means.

3. A circuit arrangement according to claim 1 wherein said processing means contains a microprocessor.

4. A circuit arrangement according to claim 3 wherein said processing means respectively automatically sets itself such that disturbances contained in said rectangular signals are eliminated.

5. A circuit arrangement for conversion of analog signals into binary signals, comprising:

means for generating rectangular signals from said analog signals wherein edges of said rectangular signals are allocated to zero axis crossings of said analog signals;

a control means for always noramlly generating binary signals form said rectangular signals when said rectangular signals change their binary values;

said control means having delay means for delaying said rectangular signals and a plurality of parallel outputs at which delayed rectangular signals are output, the delayed rectangular signals being delayed in steps by a prescribed time duration which is significantly shorter than a period duration of said rectangular signals;

said control means having a processing means at which said delayed rectangular signals are present for generating a binary signal when said delayed rectangular signals simultaneously have prescribed binary values; and said processing means containing switching stage means for every direction of a change of the binary values of said rectangular signals, and outputs of said switching stage means being connected to inputs of an OR element at whose output said binary signals are emitted.

6. A circuit arrangement according to claim 5 wherein AND elements are provided between said switching stage means and said OR element, a first input of said AND elements being connected to outputs of said switching stage means and an output signal of a flip-flop being connected at second inputs of said AND elements, said flip-flop means flipping into a respectively opposite position with every appearance of a binary signal.

7. A circuit arrangement according to claim 5 wherein said processing means contains a read-only memory means for allocating binary signals corresponding to a plurality of possible, simultaneously appearing binary values of delayed rectangular signals at parallel outputs of said delay means.

8. A circuit arrangement according to claim 5 wherein said processing means contains a microprocessor.

* * * * *